US 6,580,454 B1

United States Patent
Perner et al.

(10) Patent No.: US 6,580,454 B1
(45) Date of Patent: Jun. 17, 2003

(54) CMOS ACTIVE PIXEL SENSOR HAVING IN-PIXEL LOCAL EXPOSURE CONTROL

(75) Inventors: Frederick A. Perner, Palo Alto, CA (US); Charles M. C. Tan, Santa Clara, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/195,588

(22) Filed: Nov. 18, 1998

(51) Int. Cl.⁷ ................................................ H04N 3/14
(52) U.S. Cl. ........................ 348/302; 348/308; 348/297
(58) Field of Search ................................ 348/302, 308, 348/350, 297

(56) References Cited

U.S. PATENT DOCUMENTS

| | | | | |
|---|---|---|---|---|
| 4,707,124 A | * | 11/1987 | Hickey et al. | 348/308 |
| 5,008,757 A | * | 4/1991 | Kimura et al. | 348/333.01 |
| 5,461,425 A | | 10/1995 | Fowler et al. | 348/294 |
| 5,565,915 A | * | 10/1996 | Kindo et al. | 348/308 |
| 6,049,357 A | * | 4/2000 | Shinohara | 348/308 |
| 6,191,408 B1 | * | 2/2001 | Shinotsuka et al. | 250/208.1 |

FOREIGN PATENT DOCUMENTS

| EP | 0675345 | 3/1995 | ............ G01J/1/44 |
|---|---|---|---|
| WO | WO 98/14002 | 4/1998 | ............ H04N/3/15 |

* cited by examiner

Primary Examiner—Wendy R. Garber
Assistant Examiner—Matthew L Rosendale

(57) ABSTRACT

A system and a method for imaging a scene of interest utilize variable exposure periods that have durations based upon detecting a fixed voltage drop in order to determine the scene segment radiance. The rate of voltage drop corresponds to the degree of scene segment radiance, such that high radiant scene segments yield faster voltage drops than lower radiant scene segments. The variable exposure period is determined within each pixel in a pixel array of the system to gather exposure periods from different segments of the scene being imaged. The measured exposure periods are translated into grayscale information that can be used to generate a composite image having various levels of grayscale that is representative of the imaged scene. Each pixel includes a photo sensor, an analog-to-digital converter and a memory to measure, digitize and store the exposure period. The memory contains a number of memory cells having a three-transistor configuration that are each connected to a bi-directional bit line. The bi-directional bit line functions as both a read bit line and a write bit line. The three-transistor configuration allows for non-destructive read-outs of data stored in the memory cells.

16 Claims, 8 Drawing Sheets

CMOS ACTIVE PIXEL SENSOR HAVING IN-PIXEL LOCAL EXPOSURE CONTROL

TECHNICAL FIELD

The invention relates generally to imaging sensors and more particularly to an imaging sensor utilizing CMOS active pixels.

DESCRIPTION OF THE RELATED ART

Active Pixel Sensors (APSs) are utilized in various imaging devices, such as telescopes, digital cameras and video recorders. An APS captures an image of a scene of interest by converting incident light from the scene into electrical signals in an analog form. A typical active pixel sensor has an array of "pixels" or discreet regions, each pixel containing a light-sensitive element. Each light-sensitive element in a pixel generates a separate electrical current, which is proportional to the intensity of the incident light on that element. The varying magnitude of this electrical current is used as a basis for conversion into a stream of digital image data by an analog-to-digital converter (ADC), which can be stored in memory. The digitized image data from all the pixels can then be displayed as a composite image on a monitor, printed onto a sheet of paper, or analyzed for information concerning the properties of objects in the scene.

The pixels that are utilized in conventional APSs can be classified into two types of pixels. The first type of pixel is commonly referred to as an "analog pixel." An analog pixel includes a photo sensor, such as a photodiode or a phototransistor, and may include an amplifier. An associated ADC and memory are located external to the pixel. Therefore, any current generated by the photo sensor of an analog pixel is transmitted from the pixel to the external ADC as an analog signal.

The second type of pixel is known as a "digital pixel." A digital pixel includes not only a photo sensor and an amplifier, but also an ADC. In other words, the ADC is contained within the pixel, along with the photo sensor and the amplifier. Thus, the magnitude of current generated by the photo sensor is digitized within the pixel and can be transferred to off-pixel components as a digital signal. U.S. Pat. No. 5,461,425 to Fowler et al., entitled "CMOS Imaging Sensor with Pixel Level A/D Conversion," describes an imaging sensor on a single semiconductor chip having pixels of the second type. The imaging sensor of Fowler et al. has an array of pixels, wherein each pixel includes a phototransistor and an ADC. The analog signal generated by the phototransistor is converted to a serial stream of digital data bits by the on-pixel ADC. The digital data is then filtered and stored in an external memory. The on-pixel ADC is described as having the advantage of minimizing parasitic effects and distortion caused by low signal-to-noise ratio.

The prior art active pixel sensors, regardless of the pixel type, operate to image a scene of interest by quantifying the degrees of radiance from various scene segments. For each scene segment, a particular pixel quantifies the degree of radiance from the scene segment by measuring a photo voltage driven by a photo-sensor-generated current. When a photo sensor is exposed to incident light from a segment of the scene for a fixed integration or exposure time period, the magnitude of a photo voltage will be dependent upon the intensity of radiance from the scene that is being imaged by the photo sensor.

FIG. 1 illustrates the technique utilized by the prior art imaging sensors to quantify the intensity of radiance from a scene segment. Referring to FIG. 1, three lines 10, 12 and 14 are plotted with respect to voltage over time. The lines 10, 12 and 14 represent photo voltages corresponding to three degrees of radiance from the scene segment that is sensed by a prior art imaging sensor. The time period from t=0 to t=T is the fixed exposure time period utilized by the imaging sensor. The line 10 represents the voltages over time when the degree of radiance from the scene segment is the maximum level detectable by the imaging sensor. The line 14, on the other hand, represents the voltages over time when the degree of radiance from the scene segment is at the minimum level detectable by the imaging sensor. Lastly, the line 12 represents the voltages over time when the degree of radiance from the scene segment is at the mean illumination level.

At the end of the fixed exposure period, i.e., t=T, the imaging sensor quantifies the magnitude of the photo voltage using an ADC. When the degree of radiance from the scene is at the detectable maximum level, the voltage equals $V_{SAT}$, as indicated by the line 10 at t=T. At the mean illumination level, the voltage is $V_{MEAN}$, as indicated by the line 12 at t=T. Lastly, at the detectable minimum level, the voltage is $V_{RESET}$, as indicated by the line 14 at t=T. The imaging sensor configured to the limits defined by $V_{SAT}$ and $V_{RESET}$ will be able to differentiate discrete degrees of scene radiance that result in a photo voltage between $V_{SAT}$ and $V_{RESET}$. However, the amount of differentiable degrees of scene radiance that can be detected by an imaging sensor is at least partially dependent on the resolution of the ADC. As another factor that affects image quality, the radiance sensitivity may be adjusted by shortening or extending the length of the fixed exposure period, but the adjustment is a tradeoff of increasing sensitivity of either high radiant scene segments or low radiant scene segments.

Although the prior art imaging sensors operate well for their intended purpose, what is needed is an imaging sensor having a superior imaging performance, as defined by its dynamic range, and a greater sensitivity to low radiant scene segments.

SUMMARY OF THE INVENTION

A system and a method for imaging a scene of interest determine a scene segment radiance based upon time periods ("exposure periods") required to achieve a fixed voltage drop. Thus, rather than the conventional technique of sampling the voltage level after each set exposure time (i.e., time-driven sampling), sampling data is based on the time required for a set voltage drop (i.e., voltage-driven sampling). The voltage-driven sampling occurs at each pixel in a pixel array that is used to provide image information in discrete scene segments. The rate of voltage drop corresponds to the intensity of scene segment radiance, such that high radiant scene segments yield more rapid voltage drops than lower radiant scene segments. The variable exposure periods are measured for each pixel in the pixel array to gather exposure periods from different segments of the scene being imaged. The measured exposure periods are then translated into grayscale information that can be used to generate a composite image having various levels of grayscale that are representative of the imaged scene.

The variable exposure period is measured within each pixel by comparing the voltage at a floating diffusion (FD) node to a reference voltage. The voltages at the FD node and the reference voltage are input to a comparator that outputs a signal when the voltage at the FD node is equal to or less than the reference voltage. The FD node is connected to a photo sensor, e.g., photodiode, to generate a photo current in response to incident light from an associated scene segment. The generated current causes dissipation of charge from an integration capacitor connected to the FD node, causing the voltage at the FD node to decrease. The rate of decrease in voltage at the FD node is accelerated if the magnitude of the photo current is increased. Therefore, the time period for the voltage at the FD node to drop from a reset voltage to the reference voltage is mathematically related to the radiance of the scene segment from which the pixel receives light energy. This time period defines the exposure period for the scene segment being imaged.

The duration of the exposure period is then digitized for signal processing. In the preferred embodiment, each pixel includes an analog-to-digital converter (ADC) to digitize the duration of the exposure period within the pixel. The ADC is designed to capture a digital count that is supplied by an off-pixel counter. The captured digital count represents the exposure period for the scene segment being imaged. The off-pixel counter may be configured to provide linearly progressing digital counts. However, the off-pixel counter may also be configured to provide non-linear digital counts. The non-linear digital counts may be utilized to change the relationship between the exposure period and the degree of radiance from a scene segment.

In this preferred embodiment, each pixel also includes memory to store the captured digital count. The in-pixel memory contains a number of memory cells that can store the captured digital count. Preferably, the number of memory cells is at least as great as the number of bits in the digital count. The memory cells are configured such that each memory cell is coupled to a bi-directional bit line. The bi-directional bit line functions as both a read bit line and a write bit line.

The memory cells are dual port memory cells having a three-transistor configuration. Each memory cell includes a write access transistor, a read access transistor, and a data-controlled transistor. The read access transistor and the data-controlled transistor are configured to provide a conductive path from an associated bi-directional bit line to ground. The write access transistor connects the bi-directional bit line to the gate of the data-controlled transistor. A storage node is located between the write access transistor and the gate of the data-controlled transistor. Thus, the data stored in the storage node can control the conductive state of the data-controlled transistor. During a read operation, the stored data in the storage node is indirectly read by the effect of the conductive state of the data-controlled transistor. Therefore, the stored data is not destroyed during the read operation. The non-destructive feature of the memory cell allows less frequent refresh cycles, or no refresh requirement for high speed read-out applications.

An advantage of the invention is that each pixel contains an electronic shutter in which all the pixels simultaneously sense, digitize, and store digital image data in response to a scene being imaged. Thus, the pixels output digital signals, rather than analog signals. In addition, the pixels can store the digital image data for an indefinite period, and thereby functions as an image frame buffer.

Another advantage of the invention is that a greater dynamic range is achieved, which equates to superior imaging performance. Still another advantage is that sensitivity for low radiant scene segments are increased with the use of variable exposure periods. Furthermore, the pixel design is compatible with scaled CMOS technologies with a low supply voltage.

DETAILED DESCRIPTION

Figure 1:
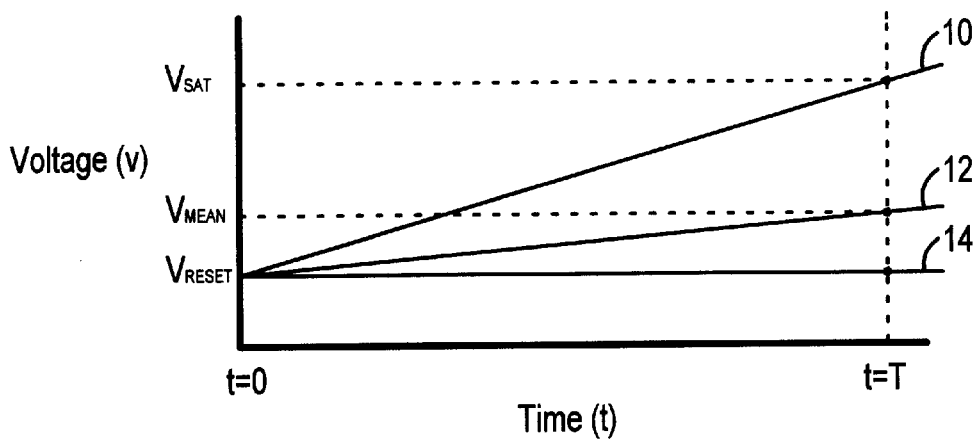
FIG. 1 is a voltage-time graph showing three lines that represent different degrees of radiance from a scene segment detected by a prior art imaging system utilizing a fixed exposure period technique.
Figure 2:
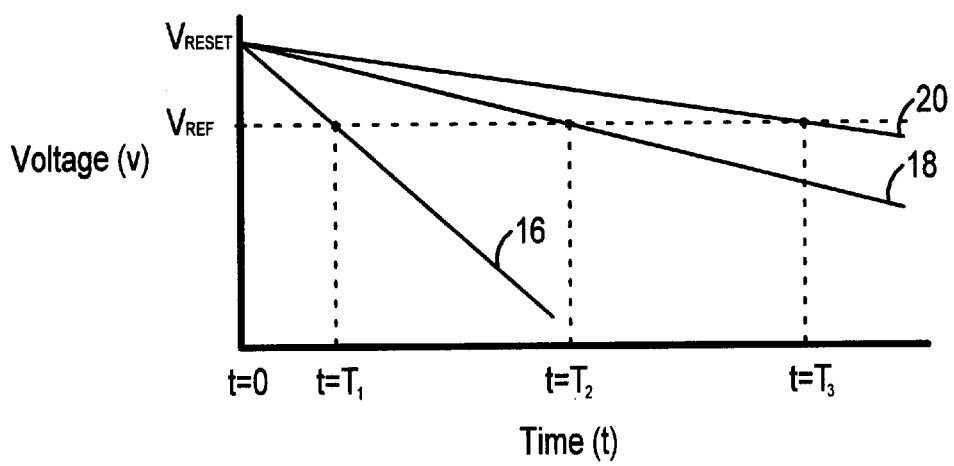
FIG. 2 is a voltage-time graph showing three lines that represent different degrees of radiance from a scene segment detected by an imaging system utilizing a variable exposure period technique in accordance with the present invention.

With reference to FIG. 2, three lines 16, 18 and 20 are plotted with respect to voltage over time, illustrating the fundamental concept utilized by the present invention to perform an imaging operation. Unlike conventional imaging sensors that utilize a fixed exposure period, an imaging sensor in accordance with the present invention measures the duration of a variable exposure time period to determine the degree of radiance from a scene segment. The measured exposure period is the time period that is required for a photo-sensor-generated current to discharge from a fixed reset voltage to a fixed reference voltage.

In FIG. 2, the reset voltage and the reference voltage are defined as $V_{RESET}$ and $V_{REF}$, respectively. Line 16 represent changes in voltage when the degree of radiance from a scene segment is the maximum level detectable by the present invention, whereas line 20 represents changes in voltage when the degree of radiance from a scene segment is the minimum level. Line 18 represents changes in voltage when the degree of radiance from a scene segment is at the mean illumination of the entire scene to be imaged. The slopes of lines 16, 18 and 20 are defined by the magnitude of a photo-sensor-generated current. However, the magnitude of the current is proportional to the degree of radiance from the scene segment. Therefore, a mathematical relationship exists between the degree of radiance from a scene segment and the slope of a line representing a change in voltage. Higher radiance levels equate to steeper negative slopes, which result in more rapid decreases in voltage from $V_{RESET}$ to $V_{REF}$.

At the maximum radiance level, the voltage has decreased from $V_{RESET}$ to $V_{REF}$ when $t=T_1$, as indicated by the line 16 at $v=V_{REF}$. At mean illumination radiance, the voltage has reached $V_{REF}$ at $t=T_2$, as indicated by the line 18 at $v=V_{REF}$. Lastly, at the minimum radiance level, the voltage has reached $V_{REF}$ at $t=T_3$, as indicated by the line 20 at $v=V_{REF}$. The three time periods defined by $T_1$, $T_2$ and $T_3$ represent the exposure periods for the three degrees of radiance. Thus, any scene segment having a degree of radiance between the maximum level and the minimum level will have an exposure period that ends between t=T, and t=T$_3$. By quantifying the time period for the voltage to drop from V$_{RESET}$ to V$_{REF}$, the degree of radiance can be determined in which a shorter exposure period equates to higher radiance.

The value of V$_{REF}$ with respect to V$_{RESET}$ affects the performance of the imaging sensor utilizing the variable exposure period technique. A high value of V$_{REF}$, or a small change in voltage between V$_{RESET}$ and V$_{REF}$, will yield a faster photo sensor response time than a low value of V$_{REF}$. However, the performance of the imaging sensor will be limited by sensor noise and by the maximum counter clock frequency allowed by a digitizer circuitry. On the other hand, a low value of V$_{REF}$ will provide a signal that is less degraded by sensor noise, but the sensor response will be slower.

Figure 3:
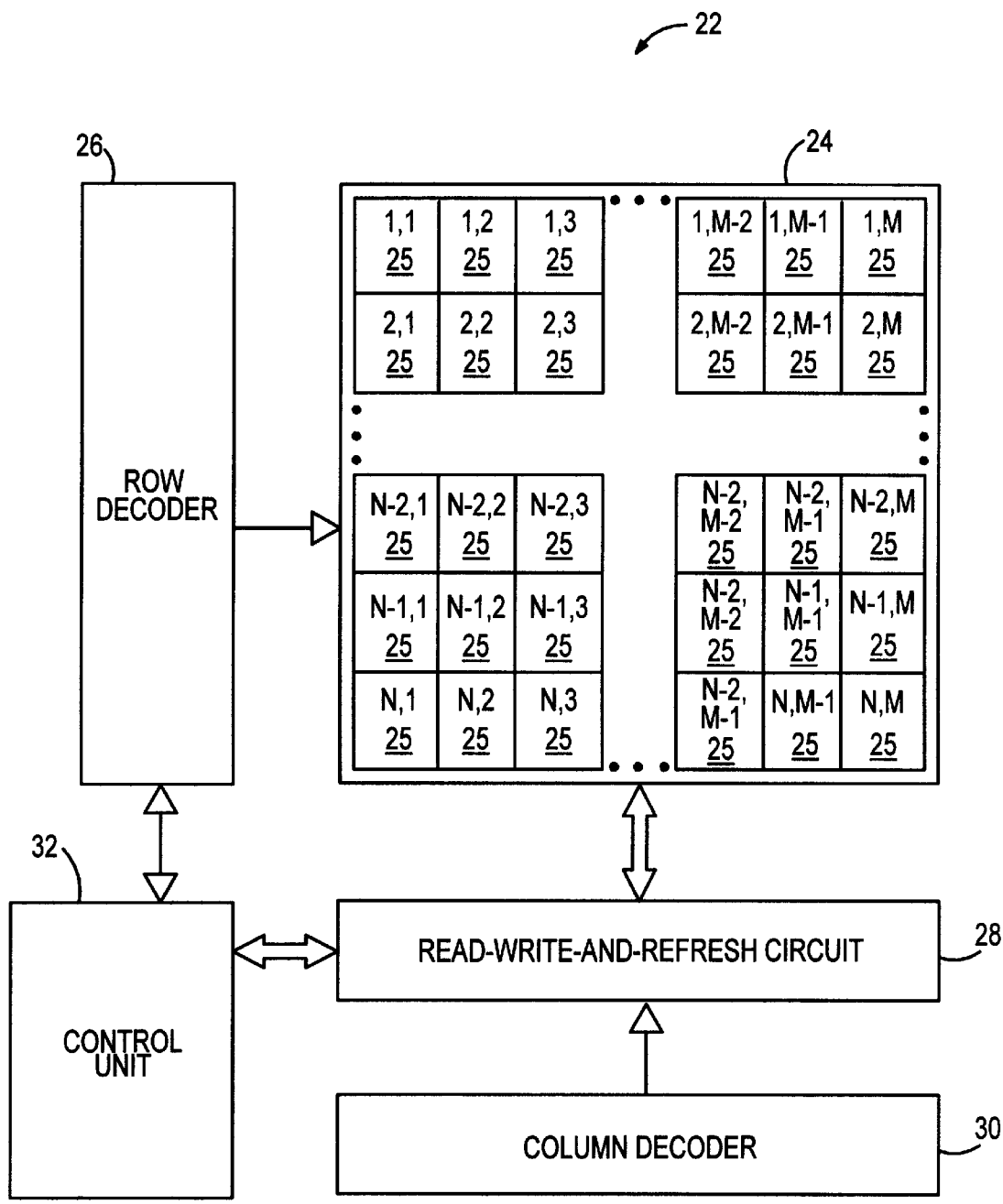
FIG. 3 is a block diagram of an imaging system in accordance with the present invention.

With reference to FIG. 3, an imaging system 22 in accordance with the present invention is shown. Preferably, the imaging system 22 is manufactured on a single semiconductor chip. The imaging system 22 utilizes the above-described technique of quantifying a variable exposure period to determine the degree of radiance from a scene segment. The imaging system 22 includes an array 24 of pixels 25. Each pixel 25 is designed to measure an exposure period in response to the degree of radiance from a scene segment and then digitize the measured exposure period. In addition, each pixel 25 is capable of storing the digitized data that represents the measured exposure period. The imaging system 22 further includes a row decoder 26, a read-write-and-refresh (RWR) circuit 28, a column decoder 30, and a control unit 32.

The row decoder 26 is configured to select a row of pixels 25 in the array 24 during a read, write or refresh operation. Similarly, the column decoder 30 operates to select a column of pixels 25 during one of the previously mentioned operations. The RWR circuit 28 is designed to direct the flow of data between the pixels 25 and the control unit 32. In addition, RWR circuit 28 includes circuitry necessary to refresh data stored within the pixels 25. The control unit 32 provides the necessary control and timing signals to the RWR circuit 28, the decoders 26 and 30, and the pixels 25.

Figure 4:
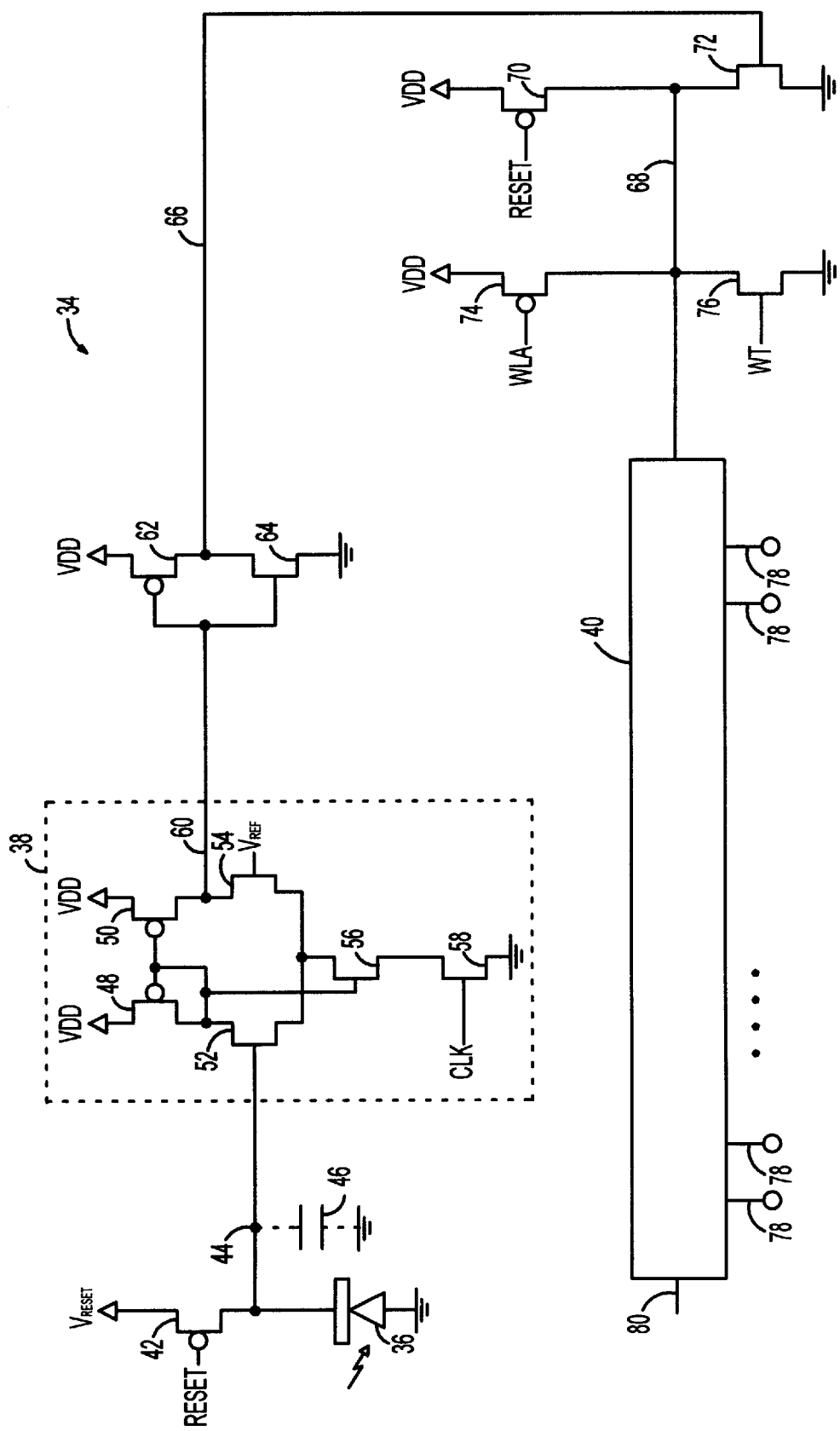
FIG. 4 is a schematic diagram of a imaging pixel circuit in accordance with the present invention.

Turning to FIG. 4, an imaging pixel circuit 34 having in-pixel local exposure control that can capture, digitize and store image data from a scene of interest is shown. The imaging pixel circuit 34 is contained within each of the pixels 25 in the array 24 of FIG. 3. The pixel circuit 34 includes a photodiode 36, a comparator 38, a dynamic buffer memory 40 and supporting circuitry. The photodiode 36 is coupled between a P-channel metal-oxide-semiconductor (PMOS) transistor 42 and electrical ground. The PMOS transistor 42 functions as a reset switch to connect the photodiode 36 to a V$_{RESET}$ voltage. The V$_{RESET}$ voltage is supplied to the PMOS transistor 42 by an external source (not shown). A RESET signal, applied to the gate of PMOS transistor 42, activates or deactivates the PMOS transistor 42. A floating diffusion (FD) node 44 connects the junction of the PMOS transistor 42 and the photodiode 36 to the comparator 38. The voltage at the FD node is the critical voltage that will be monitored to determine the exposure period for a scene segment to be imaged. Also connected to FD node 44 is an integration capacitor 46. The capacitor 46 is a built-in capacitor that is formed by the devices surrounding the FD node 44.

The comparator 38 consists of two gate-coupled PMOS transistors 48 and 50 that are connected to a supply voltage VDD. A MOS transistor 52 is connected in series with the PMOS transistor 48, while a MOS transistor 54 is connected in series with the PMOS transistor 50. The gate of MOS transistor 52 is connected to the FD node 44. However, the gate of MOS transistor 54 is connected to an external circuitry (not shown) to receive a V$_{REF}$ voltage. The MOS transistors 52 and 54 are coupled to a MOS transistor 56 such that the transistors 48 and 52 provide a first conductive path from VDD to the transistor 56 and transistors 50 and 54 provide a second conductive path from VDD to the transistor 56. The gate of transistor 56 is coupled to the gates of PMOS transistors 48 and 50. A transistor 58 connects the transistor 56 to ground. The transistor 58 is controlled by a CLK signal, which controls the activation and deactivation of the comparator 38.

The comparator 38 operates to indicate the voltage at FD node 44 with respect to the V$_{REF}$ voltage. If the voltage at FD node 44 is greater than the V$_{REF}$ voltage, the comparator 38 outputs a high signal at an output terminal 60. When the voltage at FD node 44 is equal to or less than the V$_{REF}$ voltage, the comparator 38 outputs a low signal at the output terminal 60. However, when a low CLK signal is provided to the gate of transistor 58, no current is allowed to flow through the comparator 38, deactivating the comparator 38. The lack of current flow results in a high signal at the output terminal 60, regardless of the voltage at FD node 44. A high CLK signal activates the comparator 38 to monitor the voltage at FD node 44 with respect to the V$_{REF}$ voltage.

Connected to the output terminal 60 is a pair of transistors 62 and 64. The transistor 62 is a PMOS transistor. The gates of transistors 62 and 64 are coupled to the output terminal 60. The transistors 62 and 64 are connected in series between VDD and ground. The transistor 62 is connected to VDD, while the transistor 64 is connected to ground. The transistors 62 and 64 operate to invert a signal on the output terminal 60 and transmit the inverted signal to a gate terminal 66 that is connected to a node between the transistors 62 and 64.

The inverted signal on the gate terminal 66 can drive a pre-charged high signal on a write word line (WWL) 68 to a low signal, depending upon the inverted signal. This is accomplished by a PMOS transistor 70 and a transistor 72 that provide a conductive path from VDD to ground. The gate of PMOS transistor 70 is configured to receive the RESET signal to control the conductive state of the PMOS transistor 70. The gate of transistor 72 is connected to the gate terminal 66. The RESET signal that turns "on" the PMOS transistor 42, pre-charging the voltage at FD node 44 to V$_{RESET}$, also turns "on" the PMOS transistor 70, pre-charging the voltage at the WWL 68 to VDD. When the voltage at the gate terminal 66 changes from a low signal to a high signal, the transistor 72 is activated. The activation of the transistor 72 drives the high signal on the WWL 68 from the high signal to a low signal. However, a low signal on the gate terminal 66 will not affect the signal on the WWL 68.

The WWL 68 is coupled to a PMOS transistor 74 that can also connect the WWL 68 to VDD. The PMOS transistor 74 is controlled by a word line access (WLA) signal that is supplied to the gate of transistor 74. Also coupled to the WWL 68 is a transistor 76 that can connect the WWL 68 to ground. A write terminate (WT) signal is supplied to the gate of transistor 76 to control the connection of WWL 68 to ground. The WLA and WT signals are utilized during refresh and write operations.

The WWL 68 extends to the dynamic buffer memory 40. Coupled to the dynamic buffer memory 40 are a number of bi-directional bit lines (BLs) 78. The bi-directional BLs 78 are able to carry bits of digital counts from an external counter (not shown) to the dynamic buffer memory 40. In addition, the bi-directional BLs 78 are configured to carry stored data from the dynamic buffer memory 40 to the RWL circuit 28. Contained within the dynamic buffer memory 40 are memory cells that can store digital data, such as a digital count. The number of memory cells corresponds to the number of bi-directional BLs 78. As an example, the number of memory cells and bi-directional BLs 78 may be sixteen. Thus, in this example, the dynamic buffer memory 40 is a 16-bit dynamic buffer memory that can store a 16-bit digital count. Also connected to the dynamic buffer memory 40 is a read word line (RWL) 80. The RWL 80 and WWL 68 are connected to the memory cells within the dynamic buffer memory 40 to access the memory cells for retrieval and storage of data. The primary function of the dynamic buffer memory 40 is to capture and store a particular digital count when the voltage at FD node 44 has dropped to $V_{REF}$. The captured digital count represents the exposure period that can be used to determine the degree of radiance from a scene segment being imaged.

Figure 5:
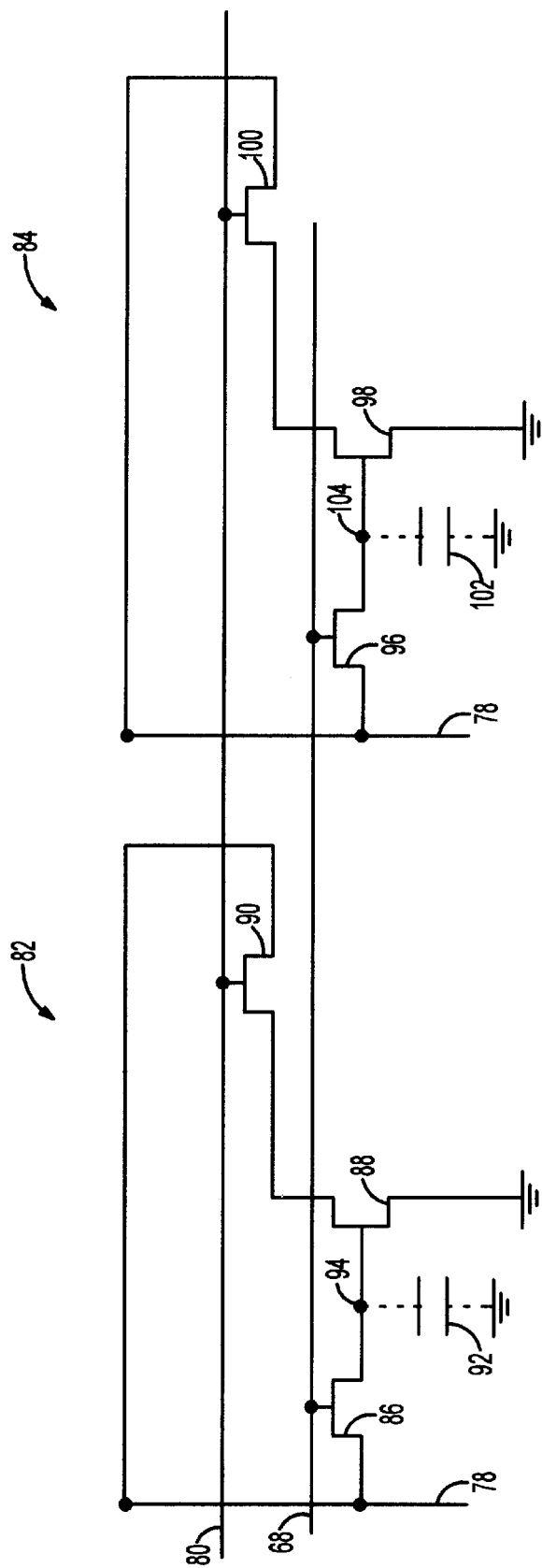
FIG. 5 is a schematic diagram of a pair of memory cells utilized in the imaging pixel circuit of FIG. 4 coupled to bi-directional bit lines in accordance with the present invention.

With reference to FIG. 5, two memory cells 82 and 84 of the dynamic buffer memory 40 are illustrated. However, the dynamic buffer memory 40 may include sixteen or more memory cells, identical to the memory cells 82 and 84. The memory cell 82 is comprised of transistors 86, 88 and 90. A storage capacitor 92 is shown to be a component of the memory cell 82 to illustrate the capacitance at a storage node 94. The transistor 86 is connected between the bi-directional BL 78 and the storage node 94. The gate of transistor 86 is coupled to the WWL 68. The transistor 86 is a write access transistor that must be activated to write data into the memory cell 82. The transistors 88 and 90 provide a conductive connection from the bi-directional BL 78 to ground. The gate of transistor 90 is coupled to the RWL 80, while the gate of transistor 88 is coupled to the storage node 94. Thus, the conductive state of the transistor 88 is controlled by a bit of data stored in the capacitor 92, when the bi-directional BL 78 is pre-charged to a high signal and the transistor 90 is activated. The transistor 90 is a read access transistor that must be activated to read the stored data in the memory cell 82. The memory cell 84 is identical to the memory cell 82. The memory cell 84 includes transistors 96, 98 and 100 and a storage capacitor 102 at a storage node 104.

The read and write operations of the memory cells 82 and 84 will be described in reference to only the memory cell 82. The operations of the memory cell 84 and other memory cells in the dynamic buffer memory 40 are identical to the operations of the memory cell 82. A write operation simply involves transmitting data to be stored through the bi-directional BL 78 and then applying a high signal to the WWL 68, activating the transistor 86. The activation of the transistor 86, connecting the capacitor 92 to the bi-directional BL, writes data from the bi-directional BL 78 to the capacitor 92. The deactivation of the transistor 86, thereafter, captures the data in the capacitor 92. A read operation involves pre-charging the bi-directional BL 78 to a high signal and activating the transistor 90. Depending upon the data stored in the capacitor 92, the high signal on the bi-directional BL 78 will be either pulled low or maintained high. A high signal, i.e., a "1", stored in the capacitor 92 will activate the transistor 88 when the transistor 90 is turned "on." The activation of both transistors 88 and 90 connects the bi-directional BL 78 to ground, pulling the high signal on the bi-directional BL 78 to a low signal.

However, if a low signal, i.e., a "0", is stored in the capacitor 92, the transistor 88 will not be activated when the transistor 90 is turned "on." Thus, the high signal on the bi-directional BL 78 will remain high. Therefore, the signal on the bi-directional BL 78, after the activation of transistor 90, is the inverse of the signal stored in the capacitor 92 as data.

The memory cells of dynamic buffer memory 40 are dynamic random access memory (DRAM) cells. These memory cells allow the stored data to be read without destroying the stored data in the process, since the stored data is applied only to gates of transistors. The non-destructive feature of the memory cells requires less frequent refresh cycles, or no refresh operation for high speed read-out applications. Therefore, the memory cells can be read numerous times without the need to refresh the stored data. However, the memory cells will need to be refreshed at some point if data is stored in the memory cells for a long period of time. Since stored data is read from the memory cells as inverted signals of the stored data in the memory cells, the signals that must be written back into the memory cells must be the inverse of the read signals, i.e., the original stored data.

Figure 6:
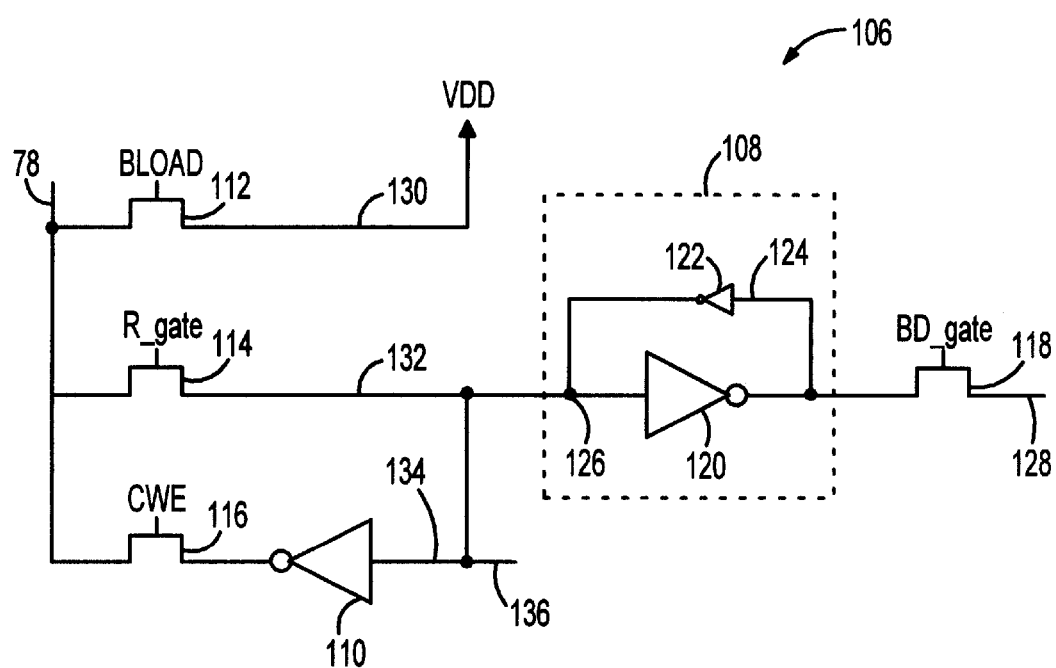
FIG. 6 is a schematic diagram of a sense amplifier circuit in accordance with the present invention.

In order to satisfy this requirement, each memory cell of dynamic buffer memory 40 is connected to a corresponding sense amplifier circuit, such as a sense amplifier circuit 106 shown in FIG. 6. The sense amplifier circuits are included in the RWR circuit 28 of FIG. 3. For illustration purposes, the sense amplifier circuit 106 will be described as if it is connected to the memory cell 82. The sense amplifier circuit 106 includes a weak feedback latch 108, an inverter 110 and transistors 112, 114, 116 and 118. The latch 108 is comprised of a large inverter 120 and a smaller inverter 122 on a feedback 124. The inverters 120 and 122 operate to hold a signal on an input node 126. The latch 108 is connected to a data bus 128. The data bus 128 provides an output path for data stored in the memory cell 82 during a read operation. The data bus 128 provides an output path from the memory cell 82 to the control unit 32 of FIG. 3. The transistor 118, that is controlled by a BD_gate signal, connects the latch 108 to the data bus 128. The latch 108 can also be conductively connected to the bi-directional BL 78 through one of two paths 132 and 134. The path 132 is conducting when the transistor 114 is activated by an R_gate signal, whereas, the path 134 is conducting when the transistor 116 is activated by a control write enable (CWE) signal. A third path 130 connects the BL 78 to VDD when the transistor 112 is activated by a BLOAD signal. Included on the path 134 is the inverter 110 that inverts sensed data from the memory cell 82 back to the original stored data during a refresh operation. One of the paths 132 and 134 also provides a connection between the bi-directional BL 78 to a write bit line (WBL) 136. The WBL 136 is connected to the external counter to receive digital count data. In addition, the WBL 136 may be connected to an off-chip external device (not shown) to receive data that is to be written into the memory cell 82. The data to be written may be the read-out data from the memory cell 82 that has been modified by the off-chip external device.

The image capturing operation of the imaging system 22 will be described with reference to FIGS. 3–6. The image capturing operation is simultaneously performed within each pixel 25 in the array 24 of FIG. 3. Each pixel 25 performs the image capturing operation in an identical manner. Initially, $V_{REF}$ is supplied to the comparator 38 of FIG. 4 at the gate of transistor 54. The RESET signal is then set low to reset the voltage at FD node 44 to $V_{RESET}$ and the voltage at WWL 68 to VDD. The resetting of the voltage at WWL 68 to VDD equates to a high signal on WWL 68, which activates the write access transistors in the memory cells of the dynamic buffer memory 40. Next, the RESET signal is switched to a high signal, turning "off" the PMOS transistors 42 and 70, and isolating FD node 44 and the WWL 68. The high RESET signal marks the beginning of a variable exposure period for all the pixels 25 in the array 24. Meanwhile, a high CWE signal is supplied to the transistor 116 of the sense amplifier circuit 106 of FIG. 6, as well as to all identical transistors of other sense amplifier circuits corresponding to the memory cells of dynamic buffer memory 40. The activation of transistor 116 of the sense amplifier circuit 106 and other identical transistors in the corresponding sense amplifier circuits provides conductive connections between the dynamic buffer memory 40 to the external counter via the bi-directional BLs 78. The conductive connections allow the external counter to transmit digital counts to the dynamic buffer memory 40. The external counter is initiated to sequentially transmit the digital counts at the start of the exposure period.

At the start of the exposure period, the voltage at FD node 44 is $V_{RESET}$, which is greater than $V_{REF}$. The comparator 38, activated by a high CLK signal, provides a high signal at the output terminal 60. The high signal at the output terminal 60 turns "on" the transistor 64 that connects the gate terminal 66 to ground, generating a low signal on the gate terminal. The low signal on the gate terminal 66 does not turn "on" the transistor 72. Thus, the high signal on the WWL 68 remains high. The consistent high signal on WWL 68 maintains the conductive state of the write access transistors in the memory cells of the dynamic buffer memory 40. Therefore, the storage capacitors of memory cells are able to receive sequential digital counts from the external counter. The imaging pixel circuit 34 will remain in this state until the voltage at FD node 44 drops to $V_{REF}$.

During the exposure period, the voltage at FD node 44 decreases from $V_{RESET}$ in response to a current generated by the photodiode 36. The rate of decrease in voltage at FD node 44 is a function of the intensity of incident light that impinges the photodiode 36. The intensity of incident light will vary in accordance to the degree of radiance from a scene of interest. When the radiance is high, the photodiode 36 generates a large current due to the increase in the intensity of incident light upon the photodiode 36. The large current causes the capacitor 46 to discharge, lowering the voltage at FD node 44. However, if the radiance from the scene is lower in magnitude, the photodiode 36 will generate a smaller current. The smaller current also causes the capacitor 46 to discharge and lower the voltage at FD node 44, but at a slower rate.

When the voltage at FD node 44 falls to $V_{REF}$, the comparator 38 generates a low signal to the output terminal 60. The low signal at the output terminal 60 deactivates the transistor 64 and activates the PMOS transistor 62. The activation of transistor 62 pulls the low signal on the gate terminal 66 to a high signal. The high signal on the gate terminal 66 then activates the transistor 72, connecting WWL 68 to ground. Thus, the high signal on WWL 68 is converted into a low signal, turning "off" the write access transistors in the memory cells of the dynamic buffer memory 40. The deactivation of write access transistors "captures" the latest digital count that was transmitted from the external counter. The external counter continues to transmit additional digital counts. However, the subsequent digital counts do not affect the captured digital count stored in the dynamic buffer memory 40. The image capturing operation is terminated after a predetermined time that is referenced from the start of the exposure period.

Although the CLK signal may be held high during the entire period between the start of the exposure period and the termination of the image capturing operation, the CLK signal may be comprised of a series of pulses to decrease power dissipation by the current drain caused by the activation of the comparator 38. The CLK signal may be synchronized to a duty cycle, such that the CLK signal is high for a short period in between the times when the digital counts are received by the dynamic buffer memory 40. Thus, the voltage at FD node 44 will be compared only during these short moments when the comparator 38 is activated. By utilizing the duty cycle, the power dissipation of the imaging pixel circuit 34 can be significantly lowered. For example, if 0.2 $\mu$A is needed for each pixel, 200 mA would be required for a million pixel sensor array. However, if the CLK signal is synchronized to a duty cycle of 1%, the required current would only be 2 mA.

In a non-complex embodiment, the digital counts that are provided by the external counter are linear counts. Furthermore, the $V_{REF}$ that is used to compare the falling voltage at FD node 44 is a constant signal. In a more complex embodiment, one or both of these features is/are modified. The external counter may be implemented with a non-linear clock period to change the relationship of exposure period and the degree of radiance from a scene of interest. For example, the external counter may utilize a logarithmic period to generate logarithmic digital counts. The captured digital count by a pixel will then have a logarithmic relationship with the exposure period, resulting in a more balanced grayscale resolution for the range of radiance intensities of the scene being imaged. In addition, the $V_{REF}$ may be provided as a non-linear signal. As an example, the $V_{REF}$ signal may increase with time in order to shorten a potentially long exposure period associated with low radiant scenes.

Figure 7:
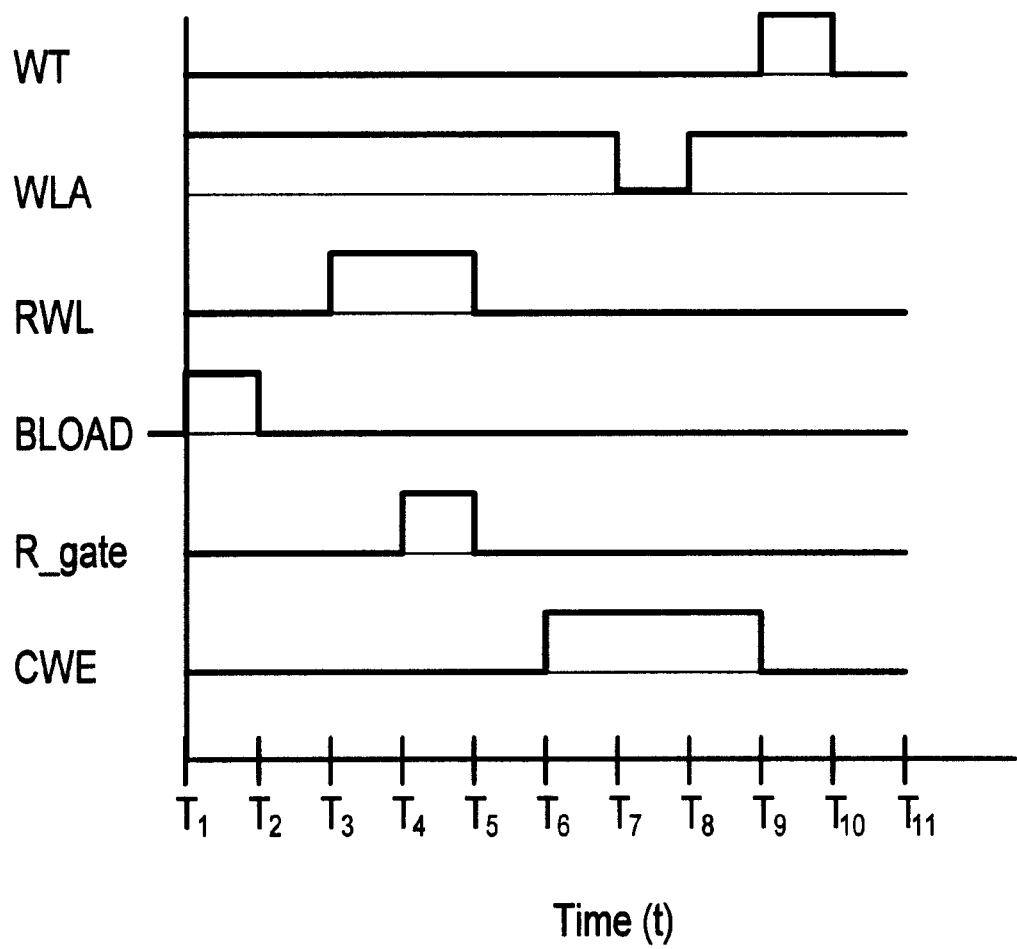
FIG. 7 is a timing diagram for a refresh operation of the imaging pixel circuit of FIG. 4.

Turning to FIG. 7, a timing diagram for a refresh operation of the imaging system 22 of FIG. 3 is shown. The refresh operation will be described with reference to FIGS. 3–6, in addition to FIG. 7. Initially, a row of pixels 25 in the array 24 is selected by the row decoder 26 to refresh the memory cells within each pixel of the row. At t=T1, a high BLOAD signal is supplied to the transistor 112 in the sense amplifier circuit 106 of FIG. 3 and identical transistors in other sense amplifier circuits that are connected to each memory cell in the selected array row. The activation of BLOAD-signal-controlled transistors connects the bi-directional BLs 78 that are associated with the memory cells to VDD, pre-charging the bi-directional BLs high.

At t=T2, the BLOAD signal drops to a low signal, deactivating the BLOAD-signal-controlled transistors. Next at t=T3, a signal on a read word line, such as the RWL 68, is switched to a high signal from a low signal, turning on the read access transistors of the memory cells in the selected array row. The activation of read access transistors allows stored data in each memory cell to either pull down the pre-charged high signal on the bi-directional BL 78 to a low signal or leave the high signal unchanged. A high signal, i.e., a "1", stored in a memory cell will pull down the high signal on a bi-directional BL to a low signal. However, a low signal, i.e., a "0", stored in a memory cell will not change the high signal on a bi-directional BL. Thus, the resulting signal on the bi-directional BLs 78 reflects the stored data in an inverted form. At t=T4, a high R_gate signal is supplied to the transistor 114 and other identical transistors in the sense amplifier circuits, connecting the bi-directional BLs 78 to the weak feedback latches in the sense amplifier circuits. The weak feedback latches hold the inverted signals from the bi-directional BLs 78.

Next at t=T5, the read access transistors and the R_gate-signal-controlled transistors are deactivated by pulling down the high signal on the read word line and switching the R_gate signal to a low signal. At t=T6, the CWE signal is switched from a low signal to a high signal, activating the transistor 116 and other identical transistors in the sense amplifier circuits. The inverted signals held by the weak feedback latches are converted to correspond to the original stored data in the memory cells by the inverter 110 and other identical inverters in the sense amplifier circuits. The converted signals are transmitted to the bi-directional BLs by the activation of CWE signal controlled transistors. Next at t=T7, the WLA signal is switched from a high signal to a low signal, turning "on" the PMOS transistor 74 of FIG. 4 and other identical PMOS transistors in the selected pixels. The activation of WLA-signal-controlled transistors connects the write word lines, such as the WWL 68, to VDD. The VDD on write word lines turns "on" the write access transistors in the memory cells of the selected pixels. The activation of write access transistors allows the converted signals from the sense amplifier circuits to be written into the memory cells.

At t=T8, the WLA is switched back to a high signal, disconnecting the write word lines from VDD. At t=T9, the CWE signal is pulled low to deactivate the CWE-signal-controlled transistors, isolating the memory cells from the sense amplifier circuits. Furthermore, a high WT signal is provided to the transistor 76 and other identical transistors in the pixels, to pull down the high signal on the write word lines to deactivate the write access transistors. At t=10, the WT signal is switched into a low signal, turning "off" the WT-signal-controlled transistors. Lastly, at t=11, the refresh cycle may be repeated.

Figure 8:
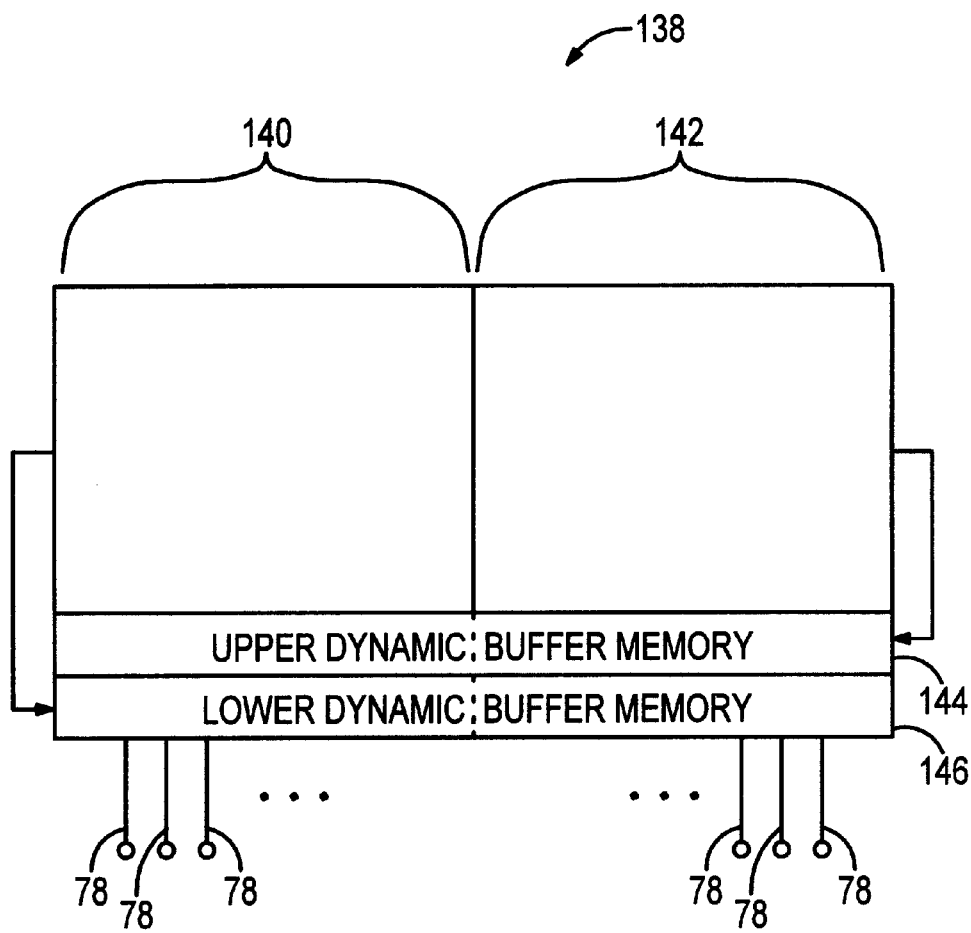
FIG. 8 is a block diagram showing a pixel pair in accordance with the preferred embodiment of the present invention.

In the preferred embodiment, the pixels 25 of FIG. 3 are configured as pixel pairs that share their pixel spaces to accommodate the two dynamic buffer memories utilized by the two pixels in each pixel pair. With reference to FIG. 8, a pixel pair 138 in accordance to the preferred embodiment is shown. The pixel pair 138 includes a left pixel 140 and a right pixel 142. The left pixel 140 utilizes an upper dynamic buffer memory 144, while the right pixel 142 utilizes a lower dynamic buffer memory 146. Half of the buffer memory 144 is located in the left pixel 140. The other half of the buffer memory 144 is located in the right pixel 142. Similarly, the buffer memory 146 is located in both the left and right pixels 140 and 142. This configuration minimizes the size of the pixels and allows the buffer memories to have sufficient storage capability for a large digital count. In this preferred embodiment, the reading and writing operation includes sequentially selecting a row of pixels 25 in the array 24 and accessing, in an alternating fashion, the lower dynamic buffer memories and the upper dynamic buffer memories. In this manner, all the pixels 25 in the array 24 can be accessed for retrieval or storage of data.

Figure 9:
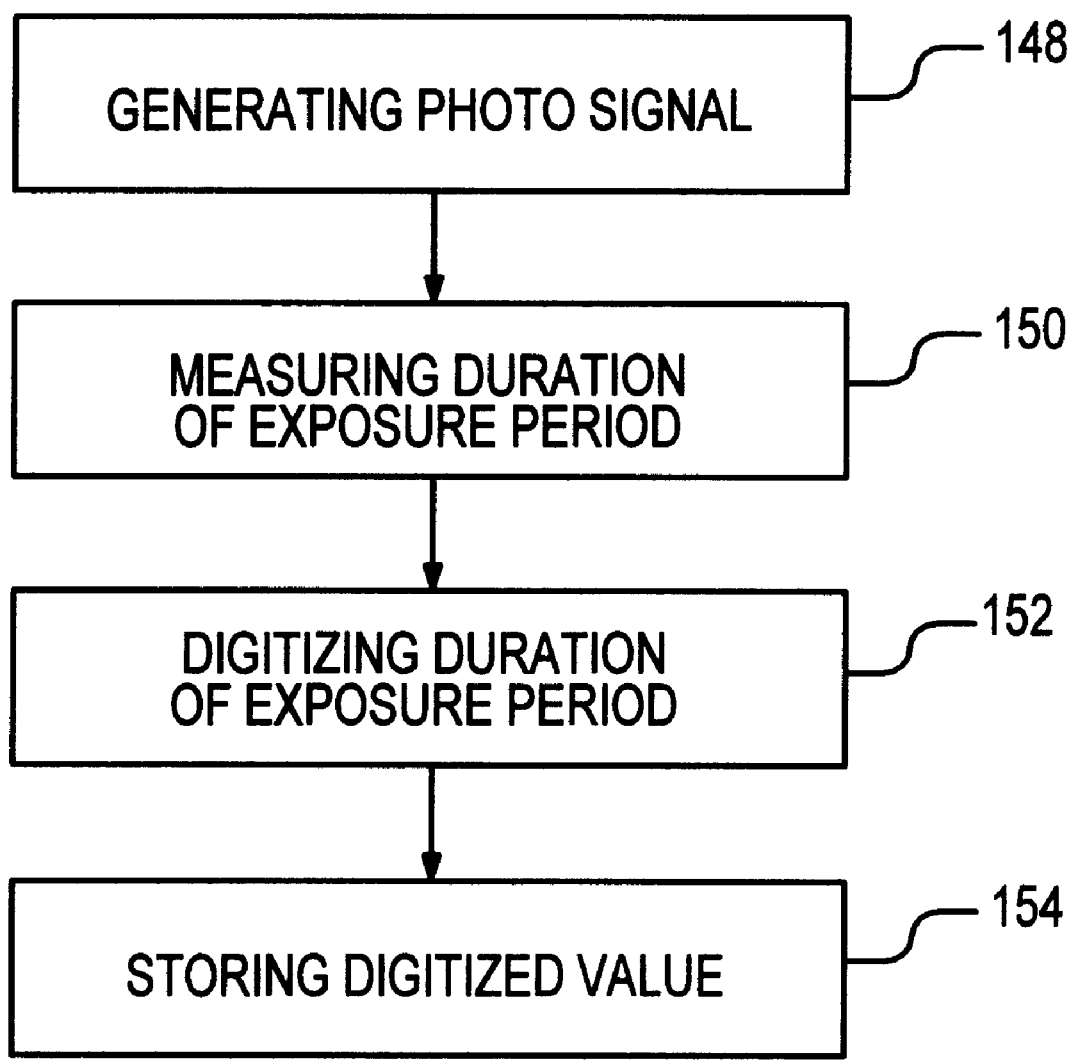
FIG. 9 is a flow diagram illustrating a method of imaging a scene of interest in accordance with the present invention.

A method of imaging a scene of interest utilizing the imaging system 22 will be described with reference to FIG. 9. At step 148, a photo signal is generated by a photodiode within a particular pixel of the imaging system 22 in response to a radiance from the scene of interest. The degree of radiance determines a magnitude of the photo signal. At step 150, a duration of an exposure period is measured to determine the relative strength of the photo signal. The duration of the exposure period is defined by a fixed decrease in voltage of an exposure signal from a reset voltage to a reference voltage, wherein the rate of decrease is dependent on the magnitude of the photo signal. Next, at step 152, the duration of the exposure period is digitized into a digital value. The digitization of the exposure period duration is preferably performed within the pixel of the imaging system 22. At step 154, the digital value is stored in a memory associated with that pixel. In the preferred embodiment, the memory is located within a pixel array of the imaging system 22.

What is claimed is:

1. An imaging system having a photosensitive area formed by an array of pixels, each pixel comprising:
   photo-sensing means for generating a photo signal that is responsive to an intensity of incident light on said pixel, said intensity of incident light corresponding to a degree of radiance from a scene of interest;
   converting means operatively connected to said photo-sensing means for forming a time-dependent signal as a function of variable length exposure periods of said photo-sensing means, said variable length exposure periods having durations that are based on a mathematical relationship with magnitudes of said photo signal such that said time-dependent signal is representative of said intensity of incident light; and
   a plurality of memory cells connected to said converting means to store bits of a digital value of said time-dependent signal, said memory cells being electrically coupled to corresponding bi-directional bit lines, each of said corresponding bi-directional bit lines configured to transfer data from and to one of said memory cells.

2. The system of claim 1 wherein said photo signal is an analog signal and said converting means is connected to receive said analog photo signal and generate said time-dependent signal in a digital format.

3. The system of claim 1 wherein said converting means includes circuitry for determining said durations of said variable length exposure periods in accordance with detecting a preselected voltage drop induced by said incident light.

4. The system of claim 1 wherein said converting means includes a monitoring means electrically coupled to said photo-sensing means for comparing an integration signal with a reference signal, said monitoring means generating a termination signal when a magnitude of said integration signal has become equivalent to a magnitude of said reference signal, said integration signal having a rate of change defined by said magnitudes of said photo signal.

5. The system of claim 4 wherein said magnitude of said reference signal is configured to vary with respect to time.

6. The system of claim 4 further comprising a counter circuit coupled to said storing means for providing a plurality of digital counts to said storing means, wherein said storing means is configured to capture a particular digital count in response to said termination signal, said particular digital count representing a duration of said variable exposure period.

7. The system of claim 1 wherein each of said memory cells includes a read port and a write port that are connected to a particular bi-directional bit line, said read port configured to transmit information regarding stored data to said particular bi-directional bit line and said write port configured to receive to-be-stored data from said particular bi-directional bit line.

8. The system of claim 7 wherein each of said memory cells further includes a storage unit connected to said write port via a write access switch, said storage unit being operatively coupled to a read conductive path from said read port to a low voltage terminal to facilitate a manipulation of a conductive state of said read conductive path in accordance to said stored data in said storage unit.

9. The system of claim 8 wherein said read conductive path includes a read access switch and a data-controlled switch, said data-controlled switch being connected to said storage unit to be responsive to said stored data in said storage unit, said read conductive path providing a conductive connection from said particular bi-directional line to said low voltage terminal when both said read access switch and said data access switch are conducting.

10. The system of claim 1 wherein said photo-sensing means is coupled to a reset switch connecting a high voltage terminal to said photo-sensing means, said reset switch being a P-channel metal-oxide-semiconductor (PMOS) transistor.

11. A method of imaging a scene of interest comprising steps of:

generating a photo signal in an analog format at a pixel region of an imaging sensor, said photo signal being responsive to an intensity of incident light sensed at said pixel region;

measuring a duration of an exposure period to determine said intensity of incident light, said exposure period being variably dependent on a magnitude of said photo signal; and digitizing said duration of said exposure period as digital data, including storing said digital data in a memory of said imaging sensor, including employing a plurality of dual port memory cells and associated bi-directional bit lines, each said bi-directional bit line being configured to transfer data from and to one of said dual port memory cells.

12. The method of claim 11 wherein said step of measuring said duration of said exposure period includes monitoring a change of an exposure signal that is allowed to dissipate, said change having a rate of decrease that is dependent on said magnitude of said photo signal.

13. The method of claim 12 wherein said step of monitoring said change of said exposure signal includes comparing said exposure signal to a reference signal, said reference signal serving as a threshold level for said exposure signal to define an end of said exposure period.

14. The method of claim 11 wherein said step of digitizing said duration of said exposure period includes executing said step of digitizing said duration of said exposure period within said pixel region.

15. An imaging system comprising:

a monolithic semiconductor substrate;

a matrix of pixels located on said monolithic semiconductor substrate, each pixel of said matrix including a photo sensor and an analog-to-digital converter, said analog-to-digital converter being configured to translate a photo signal generated by said photo sensor into a digitized value in which said digitized value is representative of a measure of a variable length exposure period of said photo sensor, said matrix having a plurality of memories that are associated with said pixels, each of said memories being configured to store said digitized value from an associated pixel; and means, electrically connected to said matrix of pixels, for providing control and timing signals to said pixels, wherein each of said memories contains a plurality of dual port memory cells that are connected to said providing means via a plurality of bi-directional bit lines to transfer data from and to said memory cells.

16. The imaging system of 15 wherein said analog-to-digital converter includes a comparator operatively connected to said photo sensor, said comparator being configured to compare an exposure signal to a reference voltage to determine a duration of said variable length exposure period, said exposure signal being responsive to said photo signal.

* * * * *